United States Patent [19]
Akashi et al.

[11] Patent Number: 4,550,307
[45] Date of Patent: Oct. 29, 1985

[54] PULSE GENERATOR

[75] Inventors: Mineo Akashi; Yoshitaka Kitada, both of Tokyo, Japan

[73] Assignee: Nippon Electric Co., Ltd., Tokyo, Japan

[21] Appl. No.: 458,079

[22] Filed: Jan. 14, 1983

[30] Foreign Application Priority Data

Jan. 14, 1982 [JP] Japan .................................. 57-4556

[51] Int. Cl.[4] ............................................ H03K 13/02
[52] U.S. Cl. ................ 340/347 DA; 307/267; 332/9 R
[58] Field of Search ............... 340/347 AD, 347 DA; 307/265–267; 332/9 R

[56] References Cited

U.S. PATENT DOCUMENTS

| 2,907,021 | 9/1959 | Woods | 340/347 DA |
|---|---|---|---|
| 3,603,977 | 9/1971 | Szabo | 340/347 DA |
| 3,754,233 | 8/1973 | Sutherland | 340/347 DA |
| 4,095,218 | 6/1978 | Crouse | 340/347 DA |
| 4,209,775 | 6/1980 | Kawashima | 340/347 DA |
| 4,233,591 | 11/1980 | Murata et al. | 340/347 DA |
| 4,346,368 | 8/1982 | Johnson | 340/347 DA |
| 4,383,245 | 5/1983 | Cooley et al. | 340/347 DA |
| 4,430,642 | 2/1984 | Weigand | 340/347 DA |
| 4,467,316 | 8/1984 | Musmann et al. | 340/347 DA |

*Primary Examiner*—B. Dobeck
*Attorney, Agent, or Firm*—Sughrue, Mion, Zinn, Macpeak, and Seas

[57] ABSTRACT

A pulse generator for use in a digital/analog converter which generates a pulse train with pulse widths modulated in accordance with an input digital signal. The leading edge of an arbitrary pulse in the pulse train is widened by one half of a clock period and the trailing edge of another pulse is widened by one half of the clock period, in accordance with the input digital signal.

10 Claims, 14 Drawing Figures

| VALUE OF DIGITAL DATA | SINGLE PWM PULSE WIDTH (μsec.) | TOTAL PWM PULSE WIDTH (μsec.) |
|---|---|---|
| 1111XXXX | 15 | 240 |
| 1110XXXX | 14 | 224 |
| 1101XXXX | 13 | 208 |
| 1100XXXX | 12 | 192 |
| 1011XXXX | 11 | 176 |
| 1010XXXX | 10 | 160 |
| 1001XXXX | 9 | 144 |
| 1000XXXX | 8 | 128 |
| 0111XXXX | 7 | 112 |
| 0110XXXX | 6 | 96 |
| 0101XXXX | 5 | 80 |
| 0100XXXX | 4 | 64 |
| 0011XXXX | 3 | 48 |
| 0010XXXX | 2 | 32 |
| 0001XXXX | 1 | 16 |
| 0000XXXX | 0 | 0 |

| VALUE OF DIGITAL DATA | INCREMENT OF TOTAL PWM SIGNAL WIDTH (μsec) |
|---|---|
| XXXX1111 | 15 |
| XXXX1110 | 14 |
| XXXX1101 | 13 |
| XXXX1100 | 12 |
| XXXX1011 | 11 |
| XXXX1010 | 10 |
| XXXX1001 | 9 |
| XXXX1000 | 8 |
| XXXX0111 | 7 |
| XXXX0110 | 6 |
| XXXX0101 | 5 |
| XXXX0100 | 4 |
| XXXX0011 | 3 |
| XXXX0010 | 2 |
| XXXX0001 | 1 |
| XXXX0000 | 0 |

PULSE GENERATOR

BACKGROUND OF THE INVENTION

1. Field of the Invention

The present invention relates to a pulse generator suitable for a digital-to-analog converter (which will be shortly referred to as a "D/A converter"), in which a highly accurate analog signal is obtained by a simple low-pass filter. More specifically, the present invention relates to a D/A converter converting a digital signal into a pulse-width-modulated (i.e., PWM) signal which is then converted into an analog signal, and especially to a PWM pulse generator in such a D/A converter.

2. Description of the Prior Art

U.S. Pat. No. 2,907,021 discloses a D/A converter which receives an input digital signal and generates a pulse with the pulse width varied in accordance with the input signal, which pulse switches a reference voltage to generate a pulse signal with a constant voltage amplitude which is in turn filtered by means of a low-pass filter thereby to obtain a direct current signal (which will be shortly referred to as a "DC signal"). In a PWM pulse generator used in the D/A converter disclosed, the value of a counter made operative for a constant period is compared with an input digital signal and the PMW signal corresponding to the input digital signal is fed out. More specifically, a flip-flop is reset at a timing corresponding to a repetition period, e.g., when the value of the counter becomes 0. The flip-flop is set when the value of the counter and the input digital signal are compared and found to be coincident. By these operations, a signal having a pulse width which is proportional to the digital input signal value is generated. The generated signal is smoothed to obtain a DC voltage which has a value corresponding to the product of the reference voltage the ratio of the pulse width to the repetition period. As is apparent from the conversion principle, the accuracy of the outpuut DC voltage is dependent upon the accuracy of the ratio of the pulse to the repetition period. Therefore, it is made possible to obtain a highly accurate D/A converter by increasing the bit number of the counter. Hence an increase in the bit number is accompanied with a rise of the clock frequency for digital synchronized circuits such as the counter or a drop of the generated pulse frequency (i.e., the elongation of the duration of the repetition period). A rise of a clock frequency and the drop of the generated pulse frequency are both undesirable, because the switching speed of field effect transistors used in large-scale integration circuits is relatively low and therefore the clock frequency cannot be raised without introducing noise, and the drop of the repetition frequency of the generated pulse necessitates the increase in the time constant of a low-pass filter for smoothing the generated pulse so that the size of the low-pass filter will be enlarged.

In order to prevent a drop of the repetition frequency of the generated pulse, therefore, it has been proposed to divisionally generate a PWM signal corresponding to each input digital signal thereby to increase the frequency component of the generated pulse. This method is disclosed in U.S. Pat. No. 3,603,977. This will be described in connection with an example of the D/A conversion of n bits. In the method disclosed in the U.S. Pat. No. 2,907,021, only one PWM signal having a pulse width of a duration corresponding to each input digital signal is generated for a repetition time t corresponding to a value $2^n$. In the system disclosed in the U.S. Pat. No. 3,603,977, on the other hand, a pulse of a pulse width $\tau$ to be generated is divided into a k number of PWM signals and is dispersed for the repetition time t. As a result, the k number of the PWM signals have a repetition time of t/k so that its frequency can be increased k times. The total width of the pulse widths $\tau_1$, $\tau_2, \ldots,$ and $\tau_k$ of the respective small pulses becomes equal to the pulse width of the time $\tau$ corresponding to the input digital signal in this case. This method, in which one DC voltage is generated by a plurality of divided PWM signals, is superior to the conventional method in which one DC voltage is generated by one PWM signal. However, these divided PWM signals have the following defect. This pulse has its minimum variation width at the width corresponding to one period of a clock frequency. As a result, upon the minimum variation of the pulse width, the width of only one of the k number of pulses is enlarged by one period of the clock frequency. Then, the generated PWM signal still contains the lower frequency component having a period of the time t.

In the D/A converter disclosed in the U.S. Pat. No. 3,603,977, therefore, sufficient attenuation can be attained for the main frequency included in the k number of pulses with the use of a simple low-pass filter which has a smaller time constant and poor cut-off frequency characteristic and which is constructed of a resistor, a capacitor and so on. For the lower frequency having the period of the time t of the pulse component corresponding to the lowest bit conversion, however, the smoothing effect of the simple low-pass filter is not very effective.

SUMMARY OF THE INVENTION

It is an object of the present invention to provide a pulse generator which is enabled to reduce the signal level of the minimum frequency contained in the pulse train of an output signal while using a clock of low frequency.

The pulse generator of the present invention is a circuit suitable for a D/A converter of the type, in which a digital input signal is converted to a PWM signal which is then converted to an analog output signal. The present invention generates a pulse train composed of a plurality of PWM signals in accordance with the digital input signal. In this pulse train, the leading edge of an arbitrary pulse is widened by one half of a clock period in accordance with a minimum step variation of the digital input signal, and the trailing edge of another pulse is widened by one half of the clock period. If the digital input signal is varied to a level larger than the minimum step, both the leading and trailing edges of an identical pulse may be simultaneously widened.

According to the present invention, there is provided a pulse generator which comprises a counter for counting the number of clock signals, and comparator means for comparing the content of the counter and a digital input signal. The pulse generator generates a pulse train composed of a plurality of pulses in dependence upon the result of the comparison, the pulse width being varied by a width of one half of the period of the clock signals in response to the variation in a lower bit of the digital input signal.

More specifically, there is provided a pulse generator which comprises a first register for storing upper bits of a digital input signal, a second register for storing lower bits, and series-connected first and second counters to count a clock signal, wherein a first signal having a pulse width corresponding to the content of the first register is generated on the basis of the value of the first counter and is fed to a serial-in parallel-out shift register, and wherein predetermined shift register outputs are selectively composed on the basis of the content of the second register and the value of the second counter thereby to generate a second signal having a pulse width other than one integer times as wide as the period of the clock signal.

The second signal may be generated by feeding the first signal to a flip-flop circuit instead of the shift register and by generating a predetermined timing signal on the basis of the judgement of the content of the second register and the value of the second counter thereby to control the write and read of the flip-flop circuit.

According to the present invention, the level of the maximum period signal contained in the pulse train of the PWM output signals, i.e., the level of the signal having a period t can be remarkably lowered, while using a clock signal having the same frequency as that of the conventional pulse generator. Moreover, with respect to the widened pulses contained in one PWM pulse train, a direct current can be canceled even if superposed on the clock signal, by making the number of pulses with widened leading edges equal to the number of pulses with widened trailing edge. According to the D/A converter including the pulse generator of the present invention, therefore, the cut-off frequency of the low-pass filter can be doubled without especially increasing the clock frequency and without deteriorating the accuracy of conversion.

BRIEF DESCRIPTION OF THE DRAWINGS

Other objects and advantages of the present invention will become apparent from the following description made with reference to the accompanying drawings, in which.

DESCRIPTION OF THE PREFERRED EMBODIMENTS

Figure 1:
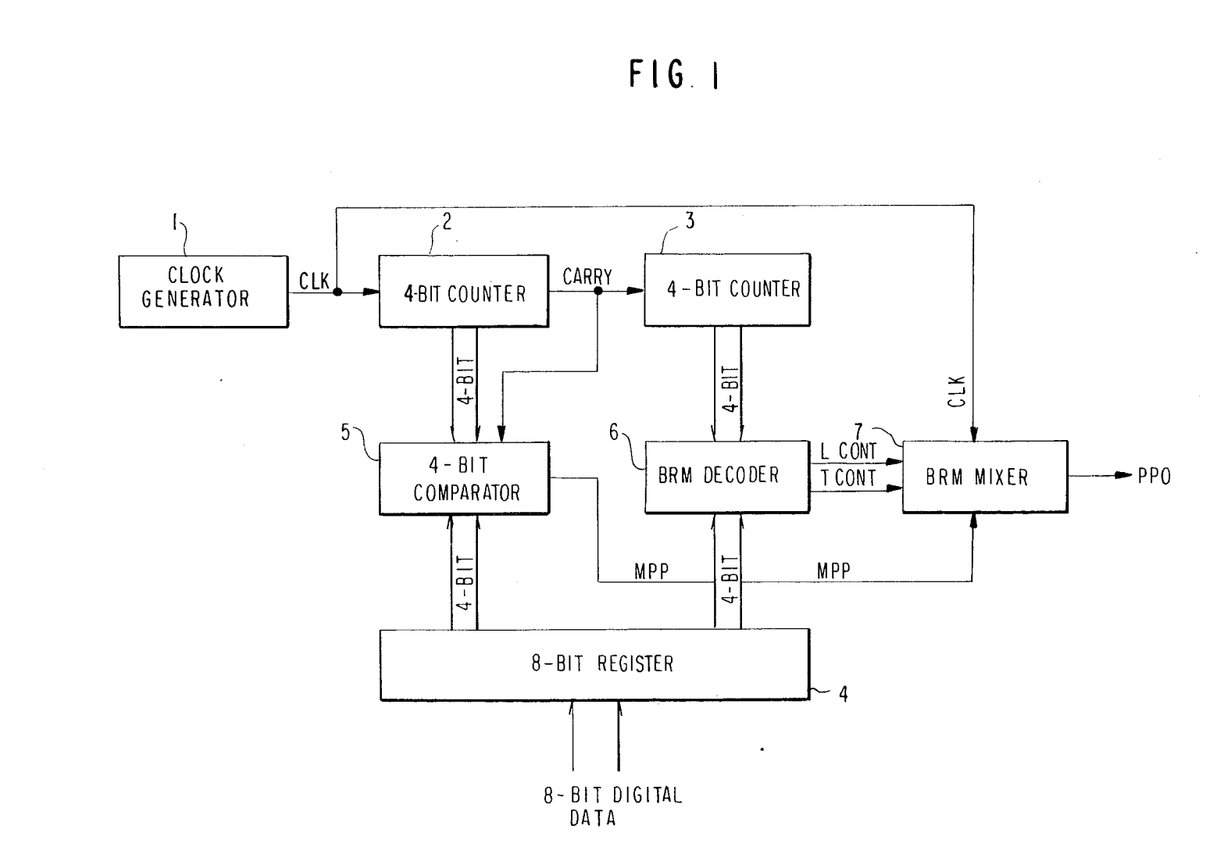
FIG. 1 is a block diagram showing a pulse generator according to one embodiment of the present invention.

With reference to FIG. 1, a pulse generator according to one embodiment of the present invention for an 8-bit D/A converter comprises a clock generator 1 for generating a clock pulse (CLK), a 4-bit counter 2 for hexadecimally counting the clock pulse (CLK), a 4-bit counter 3 for hexadecimally counting the carry output of the counter 2, an 8-bit register 4 for temporarily storing input 8-bit digital data, a 4-bit comparator 5 for comparing the upper four bits of the content of the 8-bit register 4 and the counted value of the four bits of the aforementioned 4-bit counter 2 and for generating a main PWM pulse (MPP), a bit-rate-multiplying decoder (BRM DECODER) 6 for decoding the lower four bits of the content of the 8-bit register 4 and the value of the four bits of the aforementioned 4-bit counter 3 and for generating a leading-edge control signal (LCONT) and a trailing-edge control signal (TCONT), a BRM mixer 7 for enlarging the width of a pulse of a main PWM pulse that is located in a designated position, by the LCONT signal and the TCONT signal thereby to generate a PWM pulse output (PPO).

Figure 2:
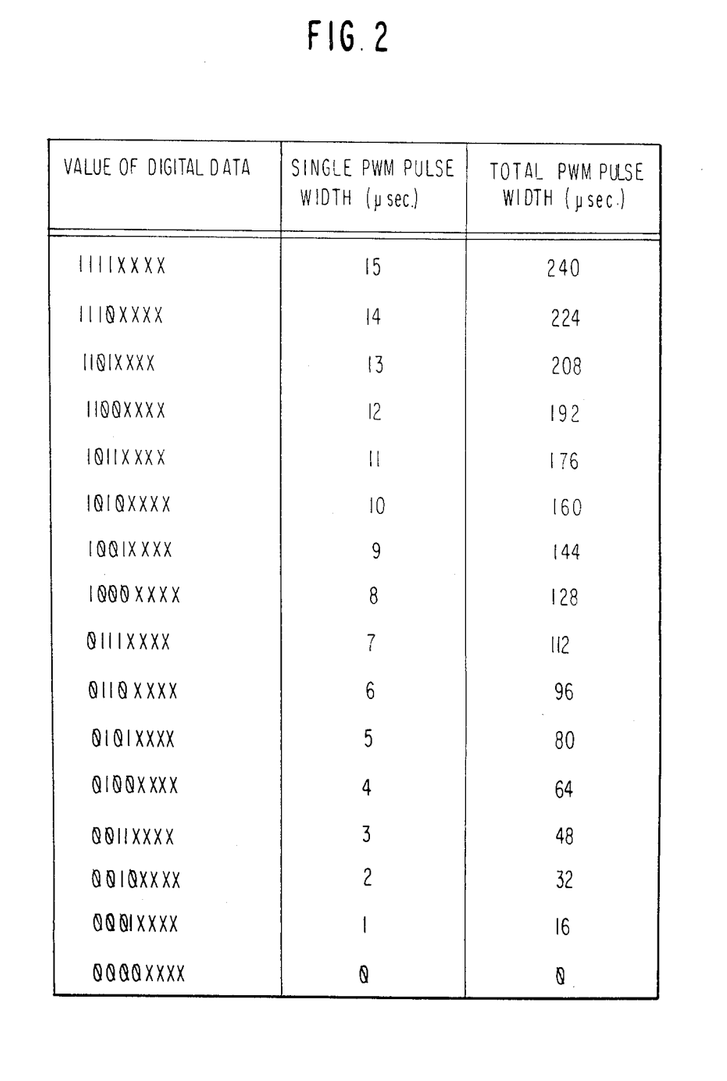
FIG. 2 is a table tabulating the relationships between the variations in the upper four bits of a digital input signal and PWM output signals.

Since, in the present embodiment, the clock pulse frequency is 1 MHz, a main PWM pulse having such a time width as is shown in FIG. 2 is generated by the result of the comparison between the counted values of the upper four bits of the digital input signal and the output of the 4-bit counter 2, both of which have been compared by the 4-bit comparator 5. The main PWM pulse thus generated has its PWM pulses formed into one group and corresponding to one 8-bit digital input data. In FIG. 2, the width of the total PWM pulse is the total value of the time widths of its sixteen pulses. The lower four bits of the 8-bit digital input data are decoded together with the counted value of the 4-bit counter 3 by the BRM decoder 6 to generate the LCONT signal for widening the leading-edge of that pulse of the aforementioned sixteen pulses, which is positioned in a designated position, and the TCONT signal for enlarging the trailing-edge of the pulse. Those LCONT and TCONT signals are fed to the BRM mixer 7, in which the width of the pulse of the aforementioned sixteen PWM pulses in the designated position is enlarged.

Figure 3:
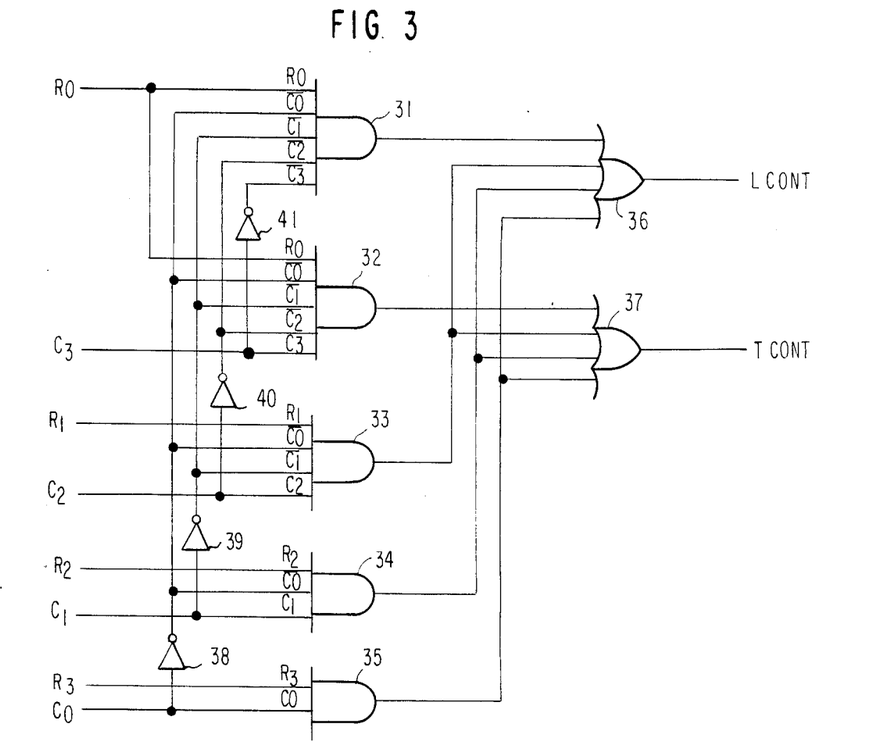
FIG. 3 is a circuit diagram showing a bit-rate-multiplier decoder used in the pulse generator of FIG. 1.

One example of the BRM decoder 6 to be used in the present embodiment will be described with reference to FIG. 3. In this decoder, if the counted value from the 4-bit counter 3 is indicated from the upper bit as ($C_3$, $C_2$, $C_1$, $C_0$) and the lower four bits of the 8-bit register 4 are indicated as ($R_3$, $R_2$, $R_1$, $R_0$), the LCONT and TCONT signals are expressed by the following logical equations:

$$LCONT = (R_0 \cdot \overline{C}_0 \cdot \overline{C}_1 \cdot \overline{C}_2 \cdot \overline{C}_3) + (R_1 \cdot \overline{C}_0 \cdot \overline{C}_1 \cdot C_2) + (R_2 \cdot \overline{C}_0 \cdot C_1) + (R_3 \cdot C_0);$$

and $$TCONT = (R_0 \cdot \overline{C}_0 \cdot \overline{C}_1 \cdot \overline{C}_2 \cdot C_3) + (R_1 \cdot \overline{C}_0 \cdot \overline{C}_1 \cdot C_2) + (R_2 \cdot \overline{C}_0 \cdot C_1) + (R_3 \cdot C_0).$$

More specifically, a five-input AND gate 31 is fed with $\overline{C}_0$, which is inverted from $C_0$ by an inverter 38, $\overline{C}_1$, which is inverted from $C_1$ by an inverter 39, $\overline{C}_2$, which is inverted from $C_2$ by an inverter 40, $\overline{C}_3$, which is inverted from $C_3$ by an inverter 41, and $R_0$ so that it generates ($R_0 \cdot \overline{C}_0 \cdot \overline{C}_1 \cdot \overline{C}_2 \cdot \overline{C}_3$) at its output. Likewise, a five-input AND gate 32 generates the AND output ($\overline{R}_0 \cdot \overline{C}_0 \cdot \overline{C}_1 \cdot \overline{C}_2 \cdot \overline{C}_3$); a four-input AND gate 33 generates the AND output ($R_1 \cdot \overline{C}_0 \cdot \overline{C}_1 \cdot C_2$); a three-input AND gate 34 generates the AND output ($R_2 \cdot \overline{C}_0 \cdot \overline{C}_1$); and a two-input AND gate 35 generates the AND output ($R_3 \cdot \overline{C}_0$). These outputs are taken into an OR logic according to the aforementioned logical Equations by four-input OR gates 36 and 37, respectively, so that the LCONT signal and the TCONT signal are obtained at the outputs of the OR gate 36 and the OR gate 37, respectively.

Figure 4:
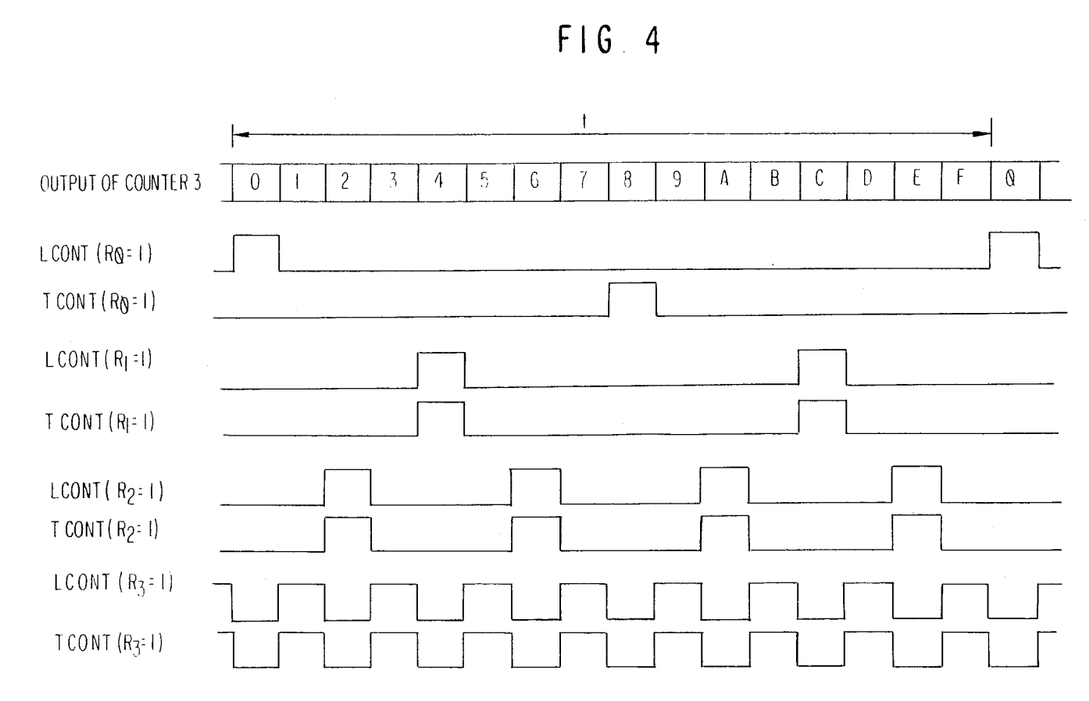
FIG. 4 is a time chart of signals in the bit-rate-multiplier decoder of FIG. 3.

FIG. 4 shows the relationship among the values of the 4-bit counter 3, the values of the lower four bits ($R_3$, $R_2$, $R_1$, $R_0$) of the 8-bit register 4, the LCONT signals and the TCONT signals. On the basis of the LCONT signals and the TCONT signals, the enlargement of the pulse width of each pulse is controlled for the count period of the count numbers 0 to F of the 4-bit counter 3. If $R_0$ takes a logical value "1", pulses made wider by a duration of the logical value "0" in one half period of a clock signal are generated at a timing of the count value 0 of the 4-bit counter 3, and pulses made wider by a duration of the logical value "1" in one half period of the clock signal are generated at a timing of count value 8. In case $R_1$ takes a logical value "1", pulses made wider by a duration of one period of the clock signal, after the leading and trailing edges of each of them are widened by a width of one half clock period, are generated at two timings of the count values 4 and C of the 4-bit counter 3. If $R_2$ takes the logical value "1", pulses made wider by a duration of one period of the clock signal are generated at four timings of the count values 2, 6, A and E. If $R_3$ takes the logical value "1", pulses made wider by a duration of one period of the clock signal are generated at eight timings of the odd count numbers of the 4-bit counter 3.

As is apparent from this time chart, the LCONT signals and the TCONT signals have different positions, in which they take the value "1", in a manner which depends on the values ($R_3$, $R_2$, $R_1$, $R_0$). As a result, if the values ($R_3$, $R_2$, $R_1$, $R_0$) are expressed by (1011), for example, the LCONT signals and the TCONT signals take the value "1" at the addition of those positions dependent upon $R_3 = 1$, $R_1 = 1$ and $R_0 = 1$. Incidentally, the BRM decoder 6 does not have to conduct its decoding operations only in accordance with the above-specified logical equations, because its necessary function as a decoder is to generate the LCONT signals and the TCONT signals at timings of different count values of the 4-bit counter 3 in a manner which depends on the values ($R_3$, $R_2$, $R_1$, $R_0$). Also, it should be noted that the count values of the 4-bit counter 3 are hexadecimally expressed in FIG. 4.

Figure 5:
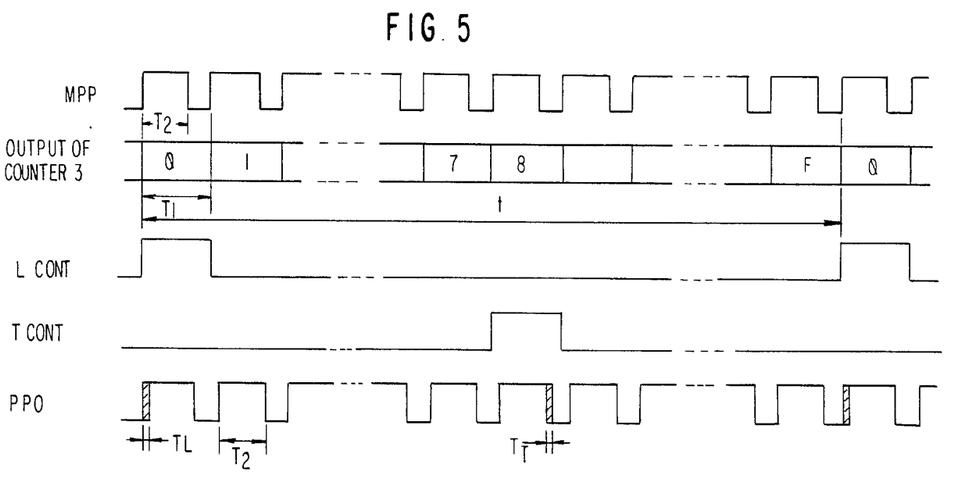
FIG. 5 is a time chart showing the variations of the PWM output signals when the lower four bits of the digital input signal are (0001)
Figure 6:
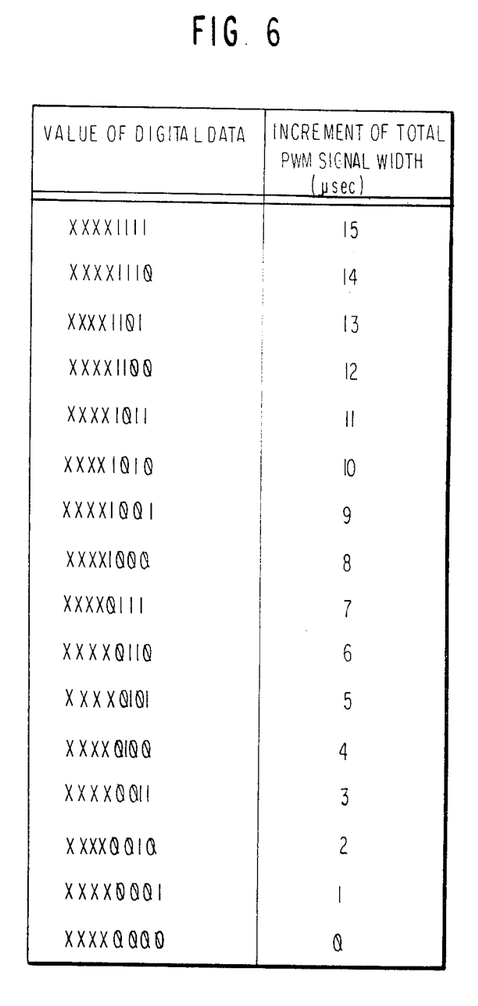
FIG. 6 is a table tabulating the variations of the lower four bits of the digital input signal and the corresponding variations of the PWM output signals.

The width of the main PWM pulse can be varied in a manner to correspond to those LCONT signals and the TCONT signals, as has been described hereinbefore. In the present embodiment, when the LCONT signals take the value "1", the leading-edge of each pulse of the main PWM pulse is widened by one half clock period, i.e., 0.5 μsec. Moreover, when the TCONT signals take the value "1", the trailing-edge of each pulse of the main PWM pulse is widened by one half clock period. As a result, if the lower four bits of the digital input data, i.e., ($R_3$, $R_2$, $R_1$, $R_0$) are varied from (0000) to (1111), the value of the PWM pulse output for the main PWM pulse is varied in steps of 1 μsec from 0 μsec to 15 μsec. This variation is shown in FIG. 5. As is apparent from FIGS. 2 and 5, the PWM pulse output has its pulse width varied in steps of 1 μsec from 0 μsec to 255 μsec in a manner to correspond to the 8-bit digital input data.

FIG. 5 is a time chart showing the main PWM pulse, the counted (hexadecimal) value of the 4-bit counter 3, the LCONT signal, the TCONT signal, and the PWM pulse output for the case in which the values ($R_3$, $R_2$, $R_1$, $R_0$) are expressed by (0001) in the embodiment of FIG. 1. The clock generator 1, the 4-bit counter 2 and the 4-bit comparator 5 are repeatedly generating the main PWM pulses of a width $T_2$, which corresponds to the data of the upper four bits of the 8-bit digital input data, at a repetition period $T_1$ of the 4-bit counter 2, i.e., 16 μsec. The 4-bit counter 3 counts up in response to the carry output of the 4-bit counter 2, i.e., each 16 μsec, and this counter value is decoded together with the lower four bits of the 8-bit digital input data, as has been described hereinbefore, to generate the LCONT signals and the TCONT signals. The PWM pulse output has its pulse width enlarged by a duration $T_L$, i.e., 0.5 μsec at a timing in which the LCONT signals take the value "1", and enlarged by a duration $T_T$, i.e., 0.5 μsec at a timing in which the TCONT signals take the value "1".

Here, according to the present invention, since the pulse width is enlarged in at least two positions during the repetition period t, as has been described hereinbefore, the lowest frequency component in the PWM pulse output, i.e., the frequency component of the repetition period t has its signal level dropped. On the other hand, the signal of the repetition period of t/2 contains both a secondary wave component of t and the fundamental frequency component of two pulses having their width enlarged by the BRM mixer 7. Since these two signals are hardly in phase, however, the added signal level drops from the respective values.

As a result, in case the PWM pulse output is to be converted into a DC form, it is possible to use a low-pass filter which has a higher cut-off frequency than the prior art, i.e., a smaller size.

Figure 7:
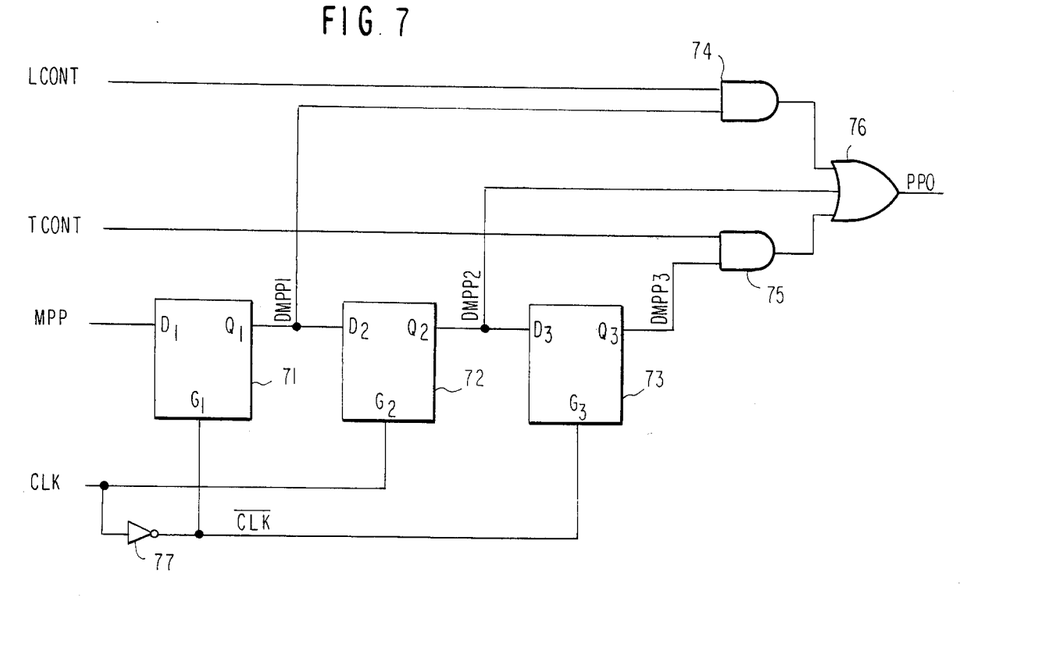
FIG. 7 is a circuit diagram showing the pulse generator embodying the present invention for varying the widths of the PWM signals in dependence upon the output of the bit-rate-multiplier decoder.
Figure 8:
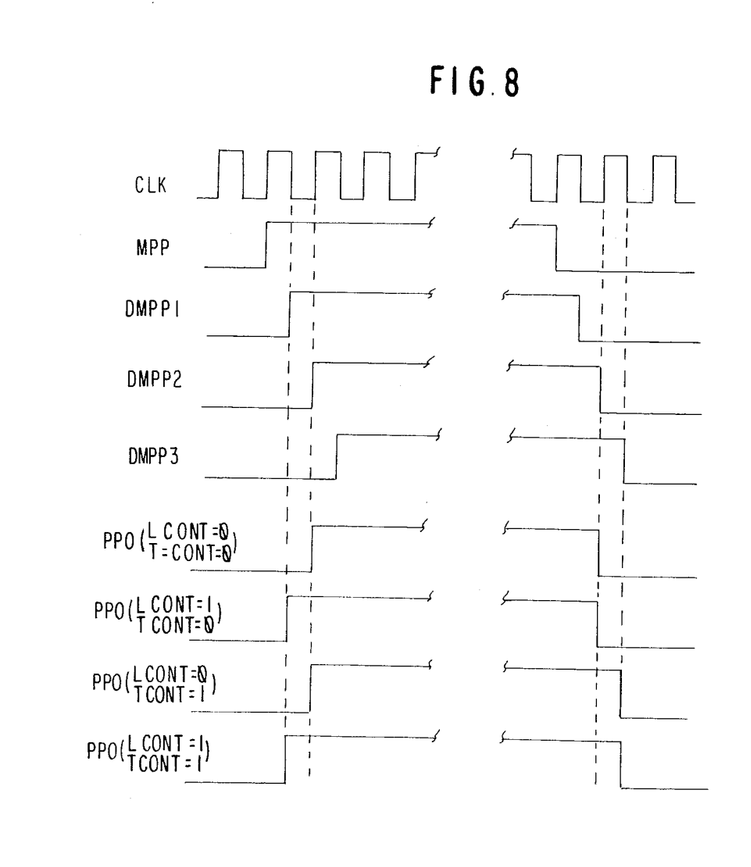
FIG. 8 is a time chart showing the pulse generator shown in FIG. 7.

Turning now to FIG. 7, the BRM mixer 7 is a circuit using a shift register and is constructed to include: a shift register composed of D-type latches 71, 72 and 73 for delaying the main PWM pulse (MPP) by one half period of the clock; an inverter 77 for applying an inverted clock pulse ($\overline{CLK}$) to the D-type latches 71 and 73; and gate circuits 74, 75 and 76 for generating the PWM pulse output (PPO) in response to the respective outputs $Q_1$, $Q_2$ and $Q_3$ of the D-type latches 71, 72 and 73 and the LCONT and TCONT signals. The D-type latches 71, 72 and 73 are made respectively operative on the basis of gate signals $G_1$, $G_2$ and $G_3$ and data inputs $D_1$, $D_2$ and $D_3$ to transmit the logical value of the data inputs $D_1$, $D_2$ and $D_3$, when the gate signals $G_1$, $G_2$ and $G_3$ take the logical value "1", to store, when the gate signals $G_1$, $G_2$ and $G_3$ are varied from the logical value "1" to "0", the logical value of the immediately previous data inputs $D_1$, $D_2$ and $D_3$, and to hold and feed out the stored value while the gate signals $G_1$, $G_2$ and $G_3$ are at the logical value "0". The first D-type latch 71 uses the inverted clock signal ($\overline{CLK}$) as its gate signals and the PWM pulse (MPP) as its data input and operates to feed out the DMPP1. The second D-type latch 72 uses the clock signal as its gate signal and the DMPP1 as its data input and operates to feed out a DMPP2. The third D-type latch 72 uses the inverted clock signal ($\overline{CLK}$) as its gate signal and the DMPP2 as its data input and operates to generate a DMPP3. The DMPP1, DMPP2 and DMPP3 are fed to the AND gate 74, OR gate 76 and AND gate 75, respectively. The AND gate 74 is made receptive of the LCONT signal and the DMPP1 to feed out its AND signal, and the AND gate 75 is made receptive of the TCONT signal and the DMPP3 to feed out its AND signal. The OR gate 76 receives inputs from the two AND gates and the DMPP2. As a result: in case both the LCONT signal and the TCONT signal take the value "0", the DMPP2 becomes the PWM pulse output (PPO); in case the LCONT signal takes the value "1" whereas the TCONT signal takes the value "0", the OR output signal determined by the DMPP1 and DMPP2 input signals becomes the PPO; in case the LCONT signal takes the value "0" whereas the TCONT signal takes the value "1", the OR output signal determined by the DMPP2 and DMPP3 input signals becomes the PPO; and in case both the LCONT signal and TCONT signal take the value "1", the OR output signal determined by the DMPP1, DMPP2 and DMPP3 input signals becomes the PPO. The time chart of the respective portions of the circuit of FIG. 7 is shown in FIG. 8. By selectively composing the outputs of the plural steps of shift registers which are connected in series by the pulse composing circuit in the aforementioned manner, it is possible to generate a signal which has a shorter time component than the period of the clock pulse. The use of that signal for the pulse width modulating digital-analog conversion can effect the reduction in the low-frequency component of the pulse.

According to the circuit construction of the embodiment of FIG. 7, moreover, since both the DMPP1 and DMPP2 and the DMPP2 and DMPP3, which are to be logically added to obtain the PPO, are shorter time delays than one period of the clock pulse and since the width of the signal pulse to be delayed is longer than the period of the clock signal, their switching operations are not conducted before the lapse of the duration of an equal logical value. This feature allows successive signals to be generated without any switching noise in the OR gate.

Next, an embodiment in which the BRM mixer 7 is constructed of an asynchronous circuit and a 1-bit register will be described in the following.

Figure 9:
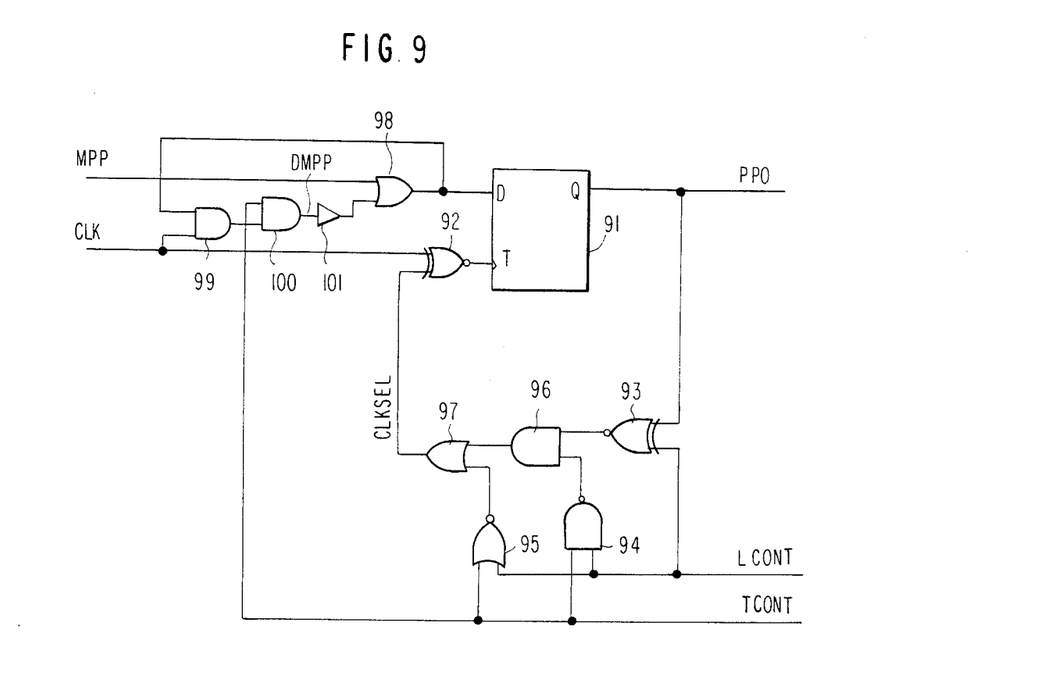
FIG. 9 is a circuit diagram showing another embodiment for varying the widths of the PWM signals in dependence upon the output of the bit-rate-multiplier decoder.
Figure 10:
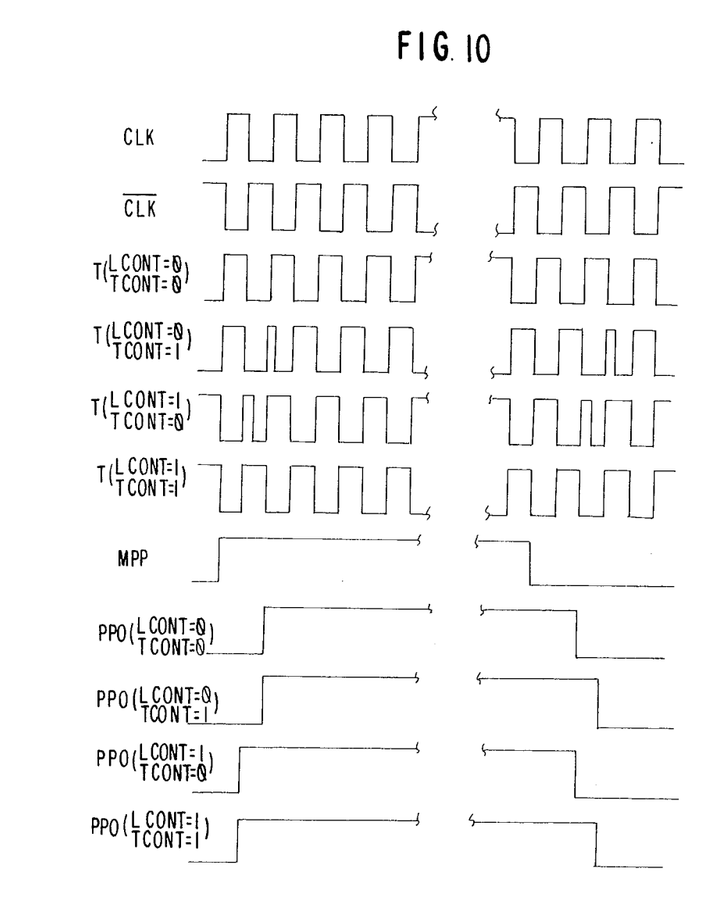
FIG. 10 is a time chart of the pulse generator shown in FIG. 9.
Figure 11:
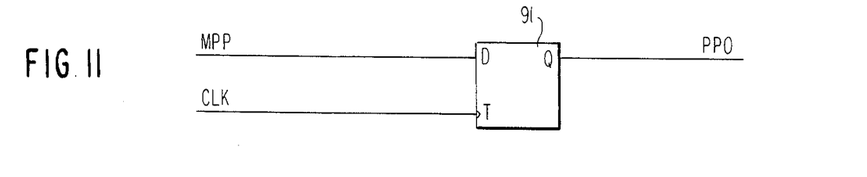
FIGS. 11 to 14 are equivalent circuit diagrams to the circuit of FIG. 9 which vary in dependence upon the output of the bit-rate-multiplier decoder shown in FIG. 7.

With reference to FIG. 9, that BRM mixer 7 is constructed to include: a 1-bit delayed flip-flop (DF/F) 91; exclusive NOR gates (EXNOR gates) 92 and 93; a two-input NAND gate 94; a two-input NOR gate 95; two-input AND gates 96, 99 and 100; two-input OR gates 97 and 98; and a buffer gate 101. The signal waveform at each input/output terminal is similar to that in the case of the synchronous circuit shown in FIG. 7 and has its time chart shown in FIG. 10. When the LCONT signal and the TCONT signal respectively take the value "0", the output of the NOR gate 95 takes the value "1" so that the output CLKSEL of an OR gate 97 takes the value "1". As a result, the clock signal CLK appears at the output of the EXNOR gate 92, i.e., at the clock input T of the DF/F 91. Since the TCONT signal takes the value "0", moreover, the output DMPP of the AND gate 100 takes the value "0" so that the main PWM pulse MPP appears as it is at the output of the OR gate 98 i.e., at the data input D of the DF/F 91. Therefore, the circuit operating at this time is equivalent to the circuit of FIG. 11 so that the signal simply delayed from the MPP is obtained as the PWM pulse output PPO.

When the LCONT signal and the TCONT signal respectively takes the values "1" and "0", the output of the NAND gate 94 takes the value "1", and the output of the NOR gate 95 takes the value "0". As a result, the AND gate 96 and the OR gate 97 will have no effect in that whatever is input from EXNOR gate 93 to the AND gate 96 will appear at the output of OR gate 97.

Figure 12:
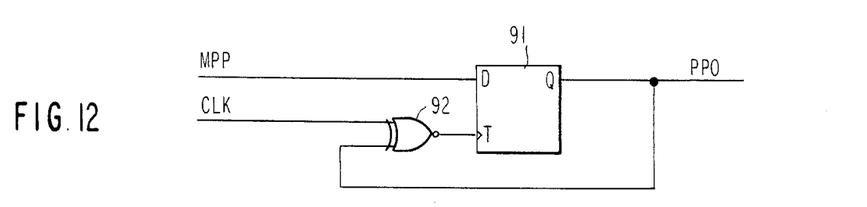

Since the LCONT signal takes the value "1", the EXNOR gate 93 generates the PWM pulse output PPO, which is applied as an input, as it is. As a result, the EXNOR gate 93 acts as if it had not been inserted in the circuit. Therefore, the clock input signal T of the DF/F 91 becomes the inverted clock signal ($\overline{CLK}$), when the PWM pulse output PPO takes the value "0", and becomes equal to the clock signal (CLK) when the PWM pulse signal PPO takes the value "1". This equivalent circuit is shown in FIG. 12.

Figure 13:
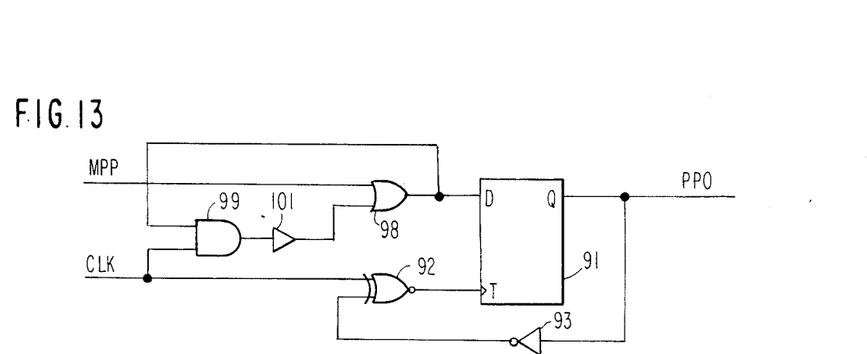

When the LCONT signal and the TCONT signal respectively takes the values "0" and "1", the AND gate 96 and the OR gate 97 will have no effect for the reason given above, and the EXNOR GATE 93 operates as an inverter. As a result, the clock input signal T becomes the clock signal (CLK), when the PWM pulse output PPO takes the value "0", and the inverted clock signal ($\overline{CLK}$) when the PWM pulse output PPO takes the value "1". In order to obtain the DMPP which is prepared by widening the trailing-edge of the MPP by one half period of the clock signal, the data input signal of the DF/F 91 is also widened. When the TCONT signal takes the value "1", more specifically, the output of the AND gate 100 becomes identical to the input from the gate 99 so that the AND signal DMPP between the output of the OR gate 98, i.e., the data input D of the DF/F 91, and the clock signal (CLK) is applied to that OR gate 98 from the AND gate 99. Incidentally, the buffer gate 101 is inserted merely to delay the signal. As a result, the data input D is held at the "1" state while the clock signal is at the value "1", even after the signal pulse of MPP has taken the value "0". As a result, the trailing-edge of the PWM pulse output (PPO), i.e., the output of the DF/F is enlarged by one half clock period, as is shown in the time chart of FIG. 10. This equivalent circuit is shown in FIG. 13.

Figure 14:
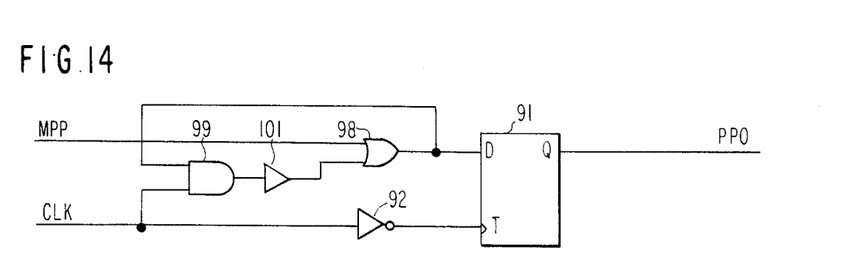

When the LCONT signal and the TCONT signal respectively takes the value "1", both the leading-edge and the trailing-edge of the signal pulse of the PWM pulse output (PPO) are simultaneously widened. By using the inverted clock signal ($\overline{CLK}$) as the clock input signal T of the DF/F 91, therefore, the leading-edge of the signal pulse is widened by one half clock period, and the trailing-edge conducts operations similar to the case, in which the LCONT signal and the TCONT signal respectively take the values "0" and "1", so that the signal pulse width is enlarged. This equivalent circuit is shown in FIG. 14.

Thus, the present embodiment generates the PWM pulse output (PPO) similarly to that of the embodiment shown in FIG. 7.

Incidentally, the pulse width, which is enlarged within the repetition period t corresponding to one PWM signal train, corresponds to at least one period of the clock signal (CLK) because the two states (i.e., the "1" and "0" states) in one period of each clock signal are used for widening the leading-edge and the trailing-edge of that pulse. As a result, even if a DC component is superposed upon the clock signal, the PWM output signal obtained has a remarkably high step accuracy.

Furthermore, the construction can naturally be remarkably simplified by using transfer gates comprised of field effect transistors as the various gates thus far exemplified.

What is claimed is:

1. A pulse generator comprising means for providing a clock signal having a clock period, means for generating a pulse train containing a plurality of signal pulses with pulse widths modulated in accordance with upper bits of an input digital signal, means for shifting the leading-edge of an arbitrary signal pulse in said pulse train by a duration of one half of the period of said clock signal in accordance with the value of lower bits of said input digital signal thereby to enlarge the pulse width of said arbitrary signal pulse, and means for shifting the trailing-edge of another signal pulse in said pulse train by a duration of one half of the period of said clock signal thereby to enlarge the pulse width of said another signal pulse.

2. A pulse generator comprising means for providing a clock signal having a clock period, means for receiving a digital signal having upper bits and lower bits, means for generating a plurality of pulse-width-modulated pulses corresponding to said upper bits, and means for shifting the leading-edge and the trailing-edge of at least two pulses of said pulse-width-modulated pulses by a duration of one half of said clock period, respectively, thereby to enlarge the overall pulse width of said pulse-width-modulated pulses by a duration of one clock period.

3. A pulse generator comprising means for providing a clock signal having a clock period, means for storing a digital signal having a plurality of bits and feeding out the respective bits in parallel, means for generating a pulse train which is composed of a plurality of pulse-width-modulated signal pulses and having a value corresponding to upper bits of said digital signal, means for enlarging the pulse width of at least one first signal pulse of said pulse train by shifting the leading-edge of said at least one first signal pulse in accordance with the value of a lower bit or lower bits of said digital signal for the duration of a "1" state or "0" state of said clock signal within one period of said clock signal, and means for enlarging the pulse width of at least one second signal pulse other than said first signal pulse by shifting the trailing-edge thereof for the duration of a "0" state or "1" state of said clock signal within one period of said clock signal.

4. A pulse generator according to claim 3, wherein the leading-edge of one signal pulse of said pulse train and the trailing-edge of another signal pulse of said pulse train are respectively shifted to enlarge the pulse widths of said signal pulses.

5. A pulse generator according to claim 4, wherein said two widened pulses are located at a spacing corresponding to about one half of the total number of the pulses contained in said pulse train.

6. A pulse generator comprising means for providing a plurality of clock signals, a register for storing a digital signal having upper and lower bits, a counter for counting the number of clock signals, means for generating a pulse signal, which has a pulse width corresponding to upper bits of the digital signal stored in said register, on the basis of the counted value of said counter, and means for widening at least one of the leading and trailing edges of said pulse signal by a width corresponding to the duration of a "1" state or "0" state of said clock signal within one period of said clock signal in response to at least one lower bit of said digital signal stored in said register.

7. A pulse generator comprising means for providing a clock signal having a clock period, a register storing a digital signal having upper and lower bits and outputting the respective bits in parallel, a first counter made operative in synchronism with said clock signal, a second counter connected in series with said first counter for conducting a counting operation, means for generating a first signal, which has a pulse width corresponding to upper bits of the stored value of said counter, shift register means for delaying the phase of said first signal in synchronism with said clock signal; and means for comparing lower bits of the stored value of said register and the counted value of said second counter to selectively control the outputs of said shift register means and thereby to generate a second signal having a pulse width corresponding to a predetermined digital value.

8. A pulse generator comprising: means for providing a plurality of clock signals, a register for storing an input digital signal having higher and lower bits; a first counter for counting the number of clock signals; a second counter for counting the output of said first counter; means for generating a first pulse signal, which has a pulse width corresponding to the value of at least one higher bit of the digital signal stored in said register, on the basis of the value of said first counter; means for comparing the value of at least one lower bit of the digital signal stored in said register and the value of said second counter thereby to generate a predetermined control signal; and temporary storage means controlled by said control signal for varying the width of said first pulse signal.

9. The pulse generator according to claim 8, wherein said temporary storage means is constructed of a 1-bit flip-flop circuit.

10. A digital-to-analog converter comprising: means for generating clock pulses having a clock pulse period, a pulse generator including a storage circuit for storing digital input data including higher and lower bits, means for generating a pulse train containing a plurality of pulse-width-modulated signal pulses corresponding to at least one higher bit of said digital input data, means for shifting at least one of the leading and trailing edges of an arbitrary signal pulse in said pulse train by a duration of one half of the period of a clock pulse in accordance with the value of a lower bit of said digital input data thereby to enlarge the pulse width, and means for shifting at least one of the trailing and leading edges of a signal pulse other than said arbitrary signal pulse by a duration of one half of the clock pulse period thereby to enlarge the pulse width; and a low-pass filter for smoothing the pulse train, which has been generated and modified by said pulse generator, to feed out a DC signal.

* * * * *

UNITED STATES PATENT AND TRADEMARK OFFICE
CERTIFICATE OF CORRECTION

PATENT NO. : 4,550,307

DATED : October 29, 1985

INVENTOR(S) : Mineo Akashi et1 al, Tokyo Japan

It is certified that error appears in the above-identified patent and that said Letters Patent is hereby corrected as shown below:

Column 1, line 27, change "PMW" to --"PWM";

line 39, change "outpuut" to --output--.

Column 5, line 8, change "$(R_2 \cdot \overline{C}_0 \cdot \overline{C}_1)$" to --$(R_2 \cdot \overline{C}_0 \cdot C_1)$--;

line 9, change "$(R_3 \cdot \overline{C}_0)$" to --$(R_3 \cdot C_0)$--.

Signed and Sealed this

Eighth Day of April 1986

[SEAL]

Attest:

DONALD J. QUIGG

Attesting Officer

Commissioner of Patents and Trademarks